United States Patent
Kim et al.

(10) Patent No.: US 7,795,936 B2
(45) Date of Patent: Sep. 14, 2010

(54) DATA CENTER TRACKING CIRCUIT AND SEMICONDUCTOR INTEGRATED CIRCUIT INCLUDING THE SAME

(75) Inventors: Yong-Ju Kim, Ichon (KR); Hee-Woong Song, Ichon (KR); Ic-Su Oh, Ichon (KR); Hyung-Soo Kim, Ichon (KR); Tae-Jin Hwang, Ichon (KR); Hae-Rang Choi, Ichon (KR); Ji-Wang Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 42 days.

(21) Appl. No.: 12/174,579

(22) Filed: Jul. 16, 2008

(65) Prior Publication Data

US 2009/0121757 A1    May 14, 2009

(30) Foreign Application Priority Data

Nov. 9, 2007    (KR)    ...................... 10-2007-0114118

(51) Int. Cl.
*H03L 7/06*    (2006.01)
(52) U.S. Cl. ...................................... 327/158; 327/149
(58) Field of Classification Search .................. 327/158
See application file for complete search history.

(56) References Cited

U.S. PATENT DOCUMENTS

| | | | |
|---|---|---|---|
| 6,373,288 B1 | 4/2002 | Ganzelmi et al. | |
| 6,543,042 B2 | 4/2003 | Kato | |
| 7,231,620 B2 | 6/2007 | Jang et al. | |
| 7,248,091 B2 | 7/2007 | Chung | |
| 7,271,634 B1 * | 9/2007 | Daga et al. | ................... 327/149 |
| 7,541,851 B2 * | 6/2009 | Gomm et al. | ................ 327/158 |

FOREIGN PATENT DOCUMENTS

| | | |
|---|---|---|
| JP | 2002049438 | 2/2002 |
| JP | 2002100980 | 4/2002 |
| JP | 2003087114 | 3/2003 |
| JP | 2007-93851 | * 3/2007 |
| JP | 2008-010607 | 1/2008 |
| KR | 1020060081559 A | 7/2006 |

OTHER PUBLICATIONS

Jeff L. Sonntag and John Stonick, "A Digital Clock and Data Receovery Architecture for Multi-Gigabit/s Binary Links", IEEE Journal of Solid-State Circuits, Aug. 2006, pp. 1867-1871, vol. 41, No. 8.
Sang-Hyun Lee, Moon-Sang Hwang, Youngdon Choi, Sungjoon Kim, Yongsam Moon, Bong-Joon Lee, Deog-Kyoon Jeong, Wonchan Kim, Young-June Park and Gijung Ahn, "A 5-Gb/s 0.25-um CMOS Jitter-Tolerant Variable-Interval Oversampling Clock/Data Recovery Circuit", IEEE Journal of Solid-State Circuits, Dec. 2002, pp. 1822-1830, vol. 37, No. 12.

* cited by examiner

*Primary Examiner*—Lincoln Donovan
*Assistant Examiner*—Daniel Rojas
(74) *Attorney, Agent, or Firm*—Baker & McKenzie LLP

(57) ABSTRACT

A data center tracking circuit includes a clock tree, a sensing block, and a delay compensation block. The clock tree includes a plurality of clock buffers connected in series, buffers a clock, and outputs an output signal. The sensing block senses the phase change of the output signal on the basis of the clock, and outputs a sensing signal. The delay compensation block adjusts current to be supplied to the clock tree in response to the sensing signal, and adjusts the phase of the output signal.

5 Claims, 3 Drawing Sheets

DATA CENTER TRACKING CIRCUIT AND SEMICONDUCTOR INTEGRATED CIRCUIT INCLUDING THE SAME

RELATED APPLICATIONS INFORMATION

The present application claims priority under 35 U.S.C. §119(a) to Korean application number 10-2007-0114118, filed on Nov. 9, 2007, which is incorporated herein by reference in its entirety as if set forth

BACKGROUND

1. Technical Field

The embodiments described herein relate to a semiconductor integrated circuit, and more particularly, to a data center tracking circuit and a semiconductor integrated circuit including the data center tracking circuit.

2. Related Art

In general, a semiconductor integrated circuit transmits and receives data to and from a chipset by using a data strobe signal. The data, which is transmitted from the semiconductor integrated circuit to the chipset, and the data strobe signal have the same phase. Further, the data, which is transmitted from the chipset to the semiconductor integrated circuit, and the data strobe signal have a phase difference of 90° therebetween.

As described above, when data is sent to a semiconductor memory device, it is preferable that the data strobe signal be toggled at the middle of a range corresponding to one bit of data. For this purpose, the semiconductor memory device generally includes a data center tracking circuit. A clock data recovery (CDR) circuit is typically used as the data center tracking circuit. The clock data recovery circuit includes a delayed locked loop (DLL) or a phase locked loop (PLL), and a clock tree.

Accordingly, a conventional clock data recovery circuit is not very efficient in terms of area and power consumption. Further, a conventional clock data recovery circuit performs a data coding operation to transmit and receive data. This can be problematic because it is difficult to accurately control data timing due to the amount of time required for the coding operation.

SUMMARY

A data center tracking circuit that stably operates despite the influence from the external environment and has improved efficiency in area usage and power consumption, and a semiconductor integrated circuit including the data center tracking circuit are described herein.

In one aspect, a data center tracking circuit includes a clock tree having a plurality of clock buffers connected in series, the clock tree configured to buffer a clock signal, and output an output signal; a sensing block configured to sense the phase change of the output signal on the basis of the clock signal, and output a sensing signal; and a delay compensation block configured to adjust a current supplied to the clock tree in response to the sensing signal, and to thereby adjust the phase of the output signal.

In another aspect, a semiconductor integrated circuit includes a DQS buffer configured to buffer a first clock signal and to output a second clock signal; a data center tracking circuit configured to buffer the second clock signal, output a third clock signal, sense the change of phase of the third clock signal, adjust the amount of current supplied to buffer the second clock signal according to a sensing result, and compensate the phase change of the third clock signal; and a latch circuit configured to latch and transmit data in synchronization with the third clock.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
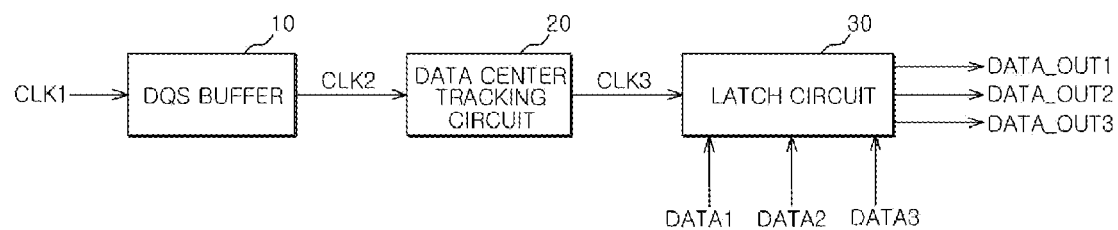
FIG. 1 is a block diagram of a semiconductor integrated circuit according to one embodiment.

FIG. 1 is a block diagram of a semiconductor integrated circuit 11 according to one embodiment. Referring to FIG. 1, the semiconductor integrated circuit 11 can include a DQS buffer 10, a data center tracking circuit 20, and a latch circuit 30.

The DQS buffer 10 can be configured to buffer a first clock signal 'CLK1' and output a second clock signal 'CLK2'. The DQS buffer 10 can be can, e.g., be configured as a conventional receiver buffer. The first clock signal 'CLK1' can be a clock signal that is generated and used in the semiconductor integrated circuit.

The data center tracking circuit 20 can be configured to buffer the second clock signal 'CLK2' and output a third clock signal 'CLK3'. The data center tracking circuit 20 can include a clock tree, and can be configured to compensate the phase change of the third clock signal 'CLK3' that results from changes in the external environment, such as temperature, power, or noise. That is, the data center tracking circuit 20 can be configured to sense the phase change of the third clock signal 'CLK3', and to adjust the amount of current supplied to buffer the second clock signal 'CLK2' on the basis of the sensing results.

Due to the operation of the above-mentioned data center tracking circuit 20, the semiconductor integrated circuit 11 can more precisely control and output the data and the phase of a data strobe signal. Therefore, it is feasible to improve the reliability of the data output operation.

The latch circuit 30 can be configured to latch data signals 'DATA1', 'DATA2', and 'DATA3' in synchronization with the third clock signal 'CLK3', and to output the data as output data signals 'DATA_OUT1', 'DATA_OUT2', and 'DATA_OUT3'. In this embodiment, the latch circuit 30 can latch three data signals in synchronization with the third clock signal 'CLK3', but the number of data signals that can be latched can be more or less depending on the requirements of a particular implementation.

Figure 2:
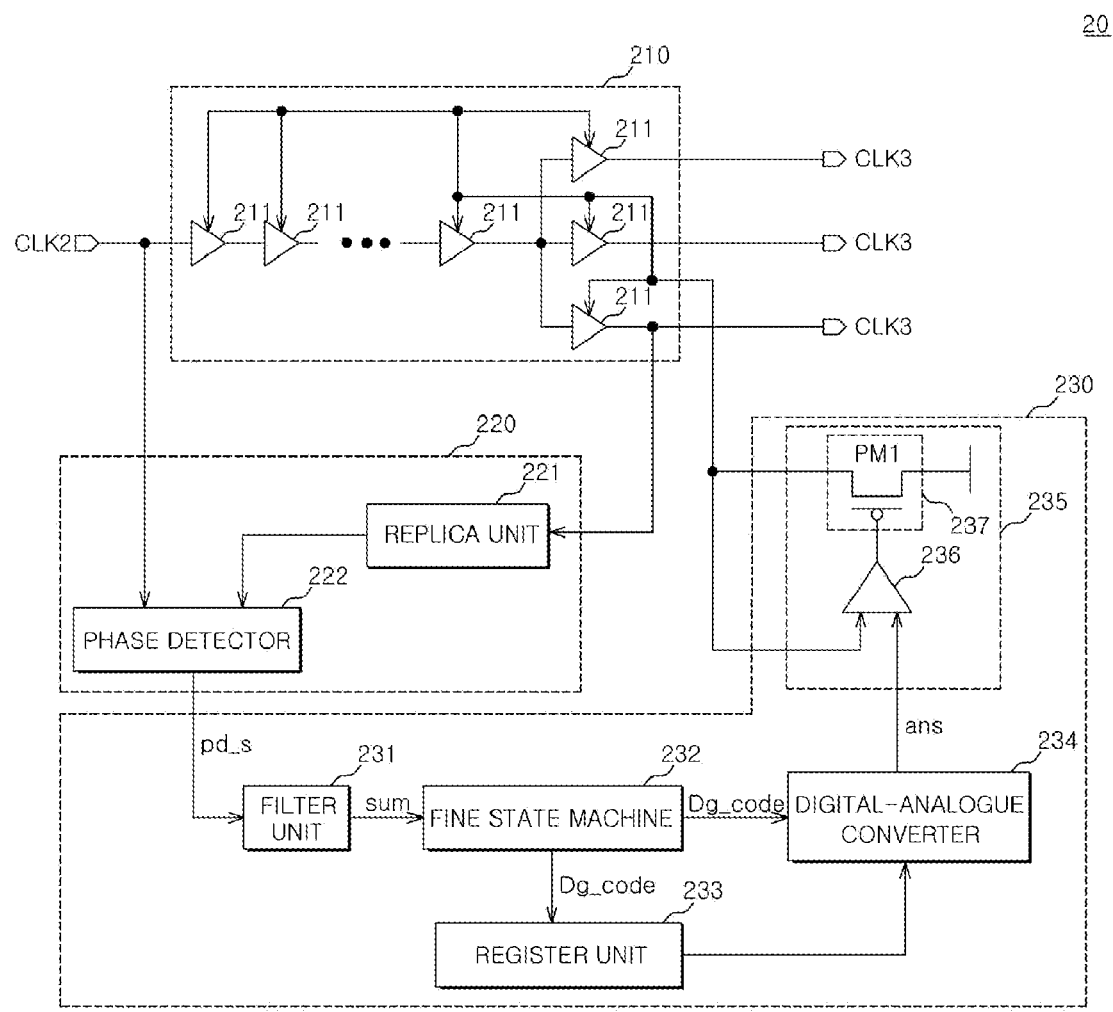
FIG. 2 is a view showing the detailed configuration of a data center tracking circuit included in the semiconductor integrated circuit of FIG. 1.

FIG. 2 is a view showing the detailed configuration of the data center tracking circuit 20 included in the semiconductor integrated circuit of FIG. 1. Referring to FIG. 2, the data center tracking circuit 20 can include a clock tree 210, a sensing block 220, and a delay compensation block 230.

The clock tree 210 can be configured to buffer the second clock signal 'CLK2' and output the third clock signal 'CLK3'. The clock tree 210 can include a plurality of clock buffers 211 connected in series.

The sensing block 220 can be configured to receive the second clock signal 'CLK2' and the third clock signal 'CLK3', sense the phase change of the third clock signal 'CLK3' with respect to the second clock signal 'CLK2', and output the sensing signal 'pd_s'. The sensing block 220 can include a replica unit 221 and a phase detector 222.

The replica unit 221 can be configured to delay the third clock signal 'CLK3' a predetermined amount to compensate for the delay that can be applied to the second clock signal 'CLK2' by the clock tree 210.

The phase detector 222 can be configured to compare the phase of the output signal of the replica unit 221 with the phase of the second clock signal 'CLK2' to generate a sensing signal 'pd_s'. The phase detector 222 can be configured to sense which of the second clock signal 'CLK2' and the output signal of the replica unit 221 precedes the other, and to output the sensing signal 'pd_s' that can have a voltage level corresponding to the sensing result. That is, the phase detector 222 can be configured to detect the signal that has a leading phase between the second clock signal 'CLK2' and the output signal of replica unit 221 and then output a sensing signal that of the same voltage level as the leading signal.

The delay compensation block 230 can be configured to control the amount of current supplied to the clock tree 210 in response to the sensing signal 'pd_s'. The delay compensation block 230 can include a filter unit 231, a fine state machine 232, a register unit 233, a digital-to-analogue converter 234, and a regulator unit 235.

The filter unit 231 can be configured to determine at a logical value of the sensing signal 'pd_s' based on the average input voltage, and to output a sum signal 'sum' based thereon. For example, if the sensing signal 'pd_s' is an UP signal for five times and is a DOWN signal for three times, then the sum signal 'sum' can be the equivalent of two UP signals.

The fine state machine 232 can be configured to output a digital code signal 'Dg_code' in response to the sum signal 'sum'. For example, the code signal 'Dg_code' can be obtained by adding or subtracting the sum signal 'sum' to or from the default value of the digital code signal 'Dg_code'. For example, if the default value of the digital code signal 'Dg_code' is 11 and the sum signal 'sum' is an UP signal for two times, then the digital code signal 'Dg_code' can become 13. If the sum signal 'sum' is one DOWN signal, then the digital code signal 'Dg_code' can become 10.

The register unit 233 can be configured to store the digital code signal 'Dg_code' and output the stored signal. When relocking is required after a power-off state, such as a power-down mode, that occurs while the register unit 233 stores the digital code signal 'Dg_code', the register unit can be configured to transmit the stored digital code signal 'Dg_code' to the digital-to-analogue converter 234.

Because delay compensation block 230 can include the register unit 233 as described above, the amount of current to be supplied to the clock tree 210 can be quickly restored when the power-down mode is exited. As a result, it is feasible to reduce the amount of time required when the data center tracking circuit 20 is normally operated.

The digital-to-analogue converter 234 can be configured to convert the digital code signal 'Dg_code' into an analogue signal 'ans'. The digital-to-analogue converter 234 can be configured as a conventional digital-to-analogue converter. The voltage level of the analogue signal 'ans' can be in the range of 0.1 to 10 times of the level of the voltage to be supplied to the clock tree 210.

The regulator unit 235 can be configured to adjust the amount of current to be supplied to the clock tree 210 in response to the analogue signal 'ans'. The regulator unit 235 can include a comparison unit 236 and a supply controller 237.

The comparison unit 236 can be configured to compare the analogue signal 'ans' with a power supply voltage that is supplied to the clock tree 210. The supply controller 237 can be configured to adjust the amount of current, which is supplied from the power supply voltage to the clock tree 210, according to the output of the comparison unit 236. As shown in FIG. 1, the supply controller 237 can be formed of a PMOS transistor PM1. When the output signal of the comparison unit 236 is at a low level, the PMOS transistor PM1 can be configured to supply current to the clock tree 210 from the power that has been applied.

In the data center tracking circuit 20 configured to have the above-mentioned configuration, if the delay of the clock tree 210 is changed due to the change of the temperature, power, noise, and the like, the phase of the third clock signal 'CLK3' output from the clock tree 210 can be also changed. The sensing block 220 can be configured to sense the phase change of the third clock signal 'CLK3', and to generate the sensing signal 'pd_s'. The delay compensation block 230 can be configured to control the amount of current, which can be used to buffer the second clock signal 'CLK2' by the clock tree 210, in response to the sensing signal 'pd_s'. Therefore, the clock tree 210 can be configured to in turn adjust the delay provided to the second clock signal 'CLK2'. As a result, the changed phase of the third clock signal 'CLK3' can be compensated.

Figure 3:
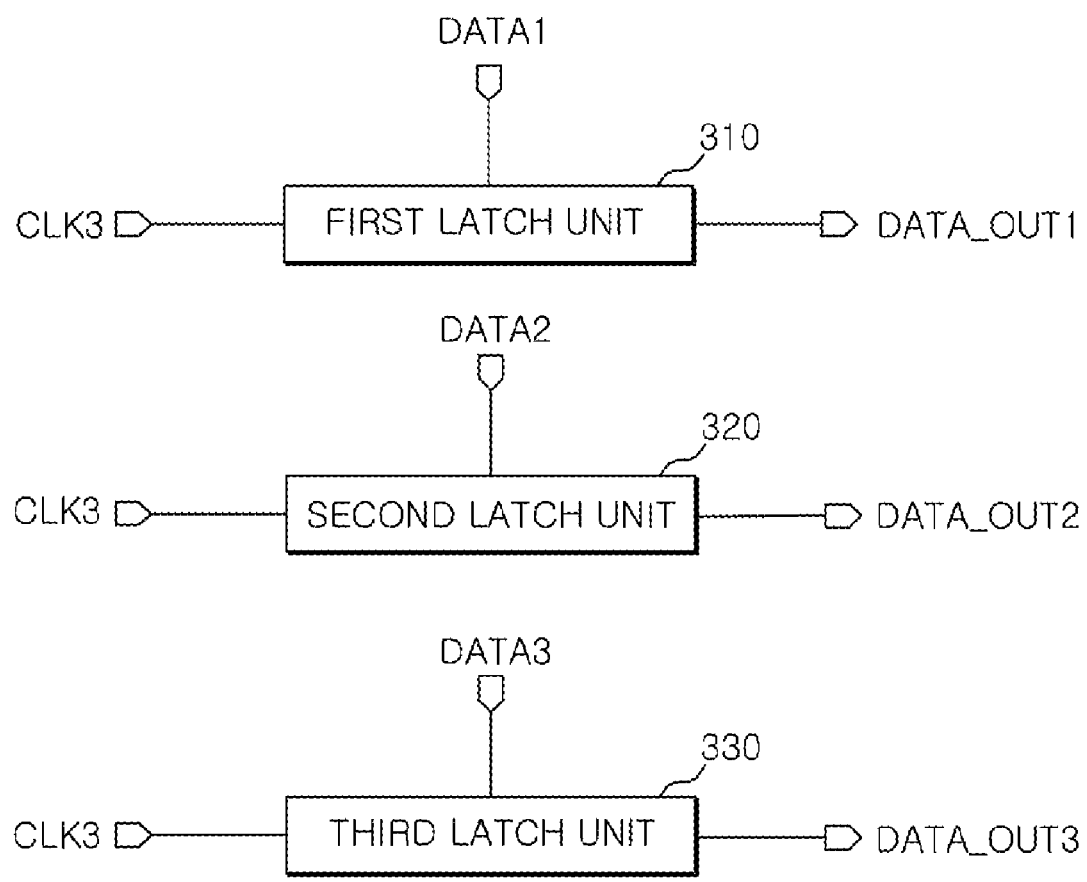
FIG. 3 is a view showing the detailed configuration of a latch circuit included in the semiconductor integrated circuit of FIG. 1.

FIG. 3 is a view showing the detailed configuration of the latch circuit 30 included in the semiconductor integrated circuit of FIG. 1. Referring to FIG. 3, the latch circuit 30 can include a plurality of latch units that correspond to the number of the data signals 'DATA1', 'DATA2', and 'DATA3'. Herein, the number of the data signals has been exemplified as three. Accordingly, three corresponding latch units (first to third latch units 310 to 330) have been shown. After the third clock signal 'CLK3' is controlled to have a constant phase despite the change of the external environment, such as temperature, power, or noise, data can be sent to the first to third latch units 310 to 330. Therefore, it is feasible to stably latch the data.

As described above, the data center tracking circuit according to various embodiments and the semiconductor integrated circuit including the data center tracking circuit have advantages in that the phase difference between data and the clock signals can be maintained at 90° by making the delay of the clock tree constant despite the change of the external environment, such as temperature, electric power, or noise. Further, because an operation such as data coding is not performed, an encoder and a decoder do not need to be provided. Therefore, it is also advantageous in terms of efficiency in area and electric power usage.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A data center tracking circuit comprising:
   a clock tree having a plurality of clock buffers connected in series, the clock tree configured to buffer a clock signal, and output an output signal;

a sensing block configured to sense the phase change of the output signal on the basis of the clock signal, and output a sensing signal; and a delay compensation block configured to adjust a current supplied to the clock tree in response to the sensing signal, and to thereby adjust the phase of the output signal, wherein the delay compensation block includes:
- a filter unit configured to determine a corresponding logic value based on the voltage level of the sensing signal input over a certain period of time, and output a sum signal based thereon;
- a fine state machine configured to output a digital code in response to the sum signal, wherein the digital code is obtained by adding or subtracting the sum signal to or from a default value of the digital code;
- a digital-to-analogue converter configured to convert the digital code into an analogue signal; and
- a regulator unit configured to adjust the amount of current input to the clock tree in response to the analogue signal; wherein the delay compensation block further comprises a register unit configured to store the digital code, and transmit the stored digital code to the digital-to-analogue converter when relocking is required.

2. The data center tracking circuit of claim 1, wherein the sensing block includes:
- a replica unit configured to delay the output signal a predetermined amount to compensate for the delay applied to the clock signal by the clock tree; and
- a phase detector configured to compare the phase of the output of the replica unit with the phase of the clock signal, and to generate the sensing signal based in the comparison.

3. The data center tracking circuit of claim 1, wherein the regulator unit includes:
- a comparison unit configured to compare the analogue signal with a power supply voltage that is supplied to the clock tree; and
- a supply controller configured to adjust the amount of current supplied from the power supply voltage to the clock tree, according to the output of the comparison unit.

4. A semiconductor integrated circuit comprising:
- a DQS buffer configured to buffer a first clock signal and to output a second clock signal;
- a data center tracking circuit configured to buffer the second clock signal, output a third clock signal, sense the change of phase of the third clock signal, adjust the amount of current supplied to buffer the second clock signal according to a sensing result, and compensate the phase change of the third clock signal; and
- a latch circuit configured to latch and transmit data in synchronization with the third clock, wherein the data center tracking circuit includes:
- a clock tree that includes a plurality of clock buffers connected in series, and configured to buffer the second clock signal, and output the third clock signal;
- a sensing block configured to sense the phase change of the third clock signal on the basis of the second clock signal, and output a sensing signal; and
- a delay compensation block configured to adjust current supplied to the clock tree in response to the sensing signal, so as to adjust the phase of the third clock signal; and wherein the delay compensation block includes:
- a filter unit configured to determine a logic level associated with the sensing signal based on the voltage level of the sensing signal over a certain time period, obtaining an average of the voltage levels of the sensing signal, and outputting a sum signal;
- a fine state machine configured to output a digital code in response to the sum signal, wherein the digital code is obtained by adding or subtracting the sum signal to or from a default value of the digital code;
- a digital-to-analogue converter configured to convert the digital code into an analogue signal; and
- a regulator unit configured to adjust the amount of current input to the clock tree in response to the analogue signal; wherein the regulator unit includes: a comparison unit configured to compare the analogue signal with a power supply voltage that is supplied to the clock tree; and a supply controller configured to adjust the amount of current supplied from the power supply voltage to the clock tree, according to the output of the comparison unit.

5. The semiconductor integrated circuit of claim 4 wherein the sensing block includes:
- a replica unit configured to delay the third clock signal a predetermined amount to compensate for the delay applied to the second clock signal by the clock tree; and
- a phase detector configured to compare the output signal of the replica unit with the phase of the second clock signal, and generate the sensing signal.

* * * * *